United States Patent [19]

Nagatsuma et al.

[11] Patent Number: 4,581,579

[45] Date of Patent: Apr. 8, 1986

[54] OPTICAL MAGNETIC-FIELD MEASURING APPARATUS HAVING IMPROVED TEMPERATURE CHARACTERISTICS

[75] Inventors: Kazuyuki Nagatsuma, Hachioji; Hiroyoshi Matsumura, Saitaka; Tsuneo Suganuma, Tokorozawa; Norio Ohta, Sayama; Keikichi Ando, Musashino; Yuzuru Hosoe, Hachioji; Yutaka Sugita, Tokorozawa, all of Japan

[73] Assignees: Hitachi, Ltd.; Hitachi Cable, Ltd., both of Tokyo, Japan

[21] Appl. No.: 545,643

[22] Filed: Oct. 26, 1983

[30] Foreign Application Priority Data

Nov. 1, 1982 [JP] Japan .................... 57-190816

[51] Int. Cl.$^4$ .............. G01R 33/02; G02B 5/30; G02F 1/29; G02F 1/31
[52] U.S. Cl. ............................. 324/244; 350/375
[58] Field of Search ............ 324/244, 262, 96; 350/374, 375, 376, 377, 378; 252/583

[56] References Cited

FOREIGN PATENT DOCUMENTS 0014879 1/1981 Japan .
0029174 3/1981 Japan .
0037277 3/1982 Japan .

OTHER PUBLICATIONS

Fowlis et al, "Rapid Method for Determining the Magnetization and Intrinsic Length of Magnetic Bubble Domain Materials", Magnetism and Magnetic Materials 1971, American Institute of Physics, pp. 240-243.

*Primary Examiner*—Ernest F. Karlsen
*Assistant Examiner*—Walter E. Snow
*Attorney, Agent, or Firm*—Antonelli, Terry & Wands

[57] ABSTRACT

In a magnetic-field measuring apparatus having a Faraday rotation property, a medium having the Faraday rotation property includes at least one magnetic garnet thin film having a composition represented by a general formula of $R_3(Fe_{5-x}M_x)O_{12}$ (where R is at least one element selected from a group consisting of La, Sm, Lu, Ca and Bi, or at least two elements selected from the group with Y being added thereto, M is at least one element selected from a group consisting of Ga, Ge, Al, Si, Sc, In and Cr, and a range of x is $0 \leq x \leq 1.5$), and magnetized in a direction of light transmission, whereby an overall temperature characteristic of a ratio ($4\pi Ms/Ho$) of a saturation flux density $4\pi Ms$ to a collapse field Ho of a strip domain of the thin film is improved. The magnetic-field measuring apparatus offers a stable measurement of magnetic-field irrespective of a temperature change.

8 Claims, 4 Drawing Figures

F I G. I

OPTICAL MAGNETIC-FIELD MEASURING APPARATUS HAVING IMPROVED TEMPERATURE CHARACTERISTICS

The present invention relates to a magnetic-field measuring apparatus, and more particularly to an optical magnetic-field measuring apparatus which utilizes an optical fiber and a rotation of optical polarization plane, and still more particularly to an optical magnetic-field measuring apparatus which enables stable magnetic-field measurement in spite of temperature change.

In order to prevent an accident in a transformer or a breaker in which a high voltage is generated and whose internal construction is not visible, and more particularly an accident in a high voltage equipment which requires a high insulation, it is effective to monitor disturbance and deviation of an electric field and a magnetic field from steady states.

In the past, in order to measure the magnetic field of the high voltage equipment, a detection coil having a coiled metal wire is used and the magnetic field is detected by converting it to an electric current or a voltage. When an area to be measured has a wide space and the insulation is high even if the coil is inserted, the insertion of the metal coil into the area to be measured poses no problem. However, if the space is very narrow or the voltage is very high and the insulation is not sufficient, the insertion of the metal coil is dangerous and impractical. Particularly, it cannot be used for a transformer of a substation which handles 100 kV or 500 kV.

In such a circumstance, a highly insulative medium such as an optical fiber may be used, but a known optical magnetic-field measuring apparatus is difficult to measure a magnetic field in a spatially narrow area.

Recently, as a magnetic-field measuring apparatus which overcomes the above shortcomings, a magnetic-field measuring apparatus which uses an optical fiber and a magnetic garnet and utilizes Faraday rotation has been proposed (Japan Utility Model Registration Application Laid-Open No. 57-14879). An improvement of such magnetic field measuring apparatus to enhance a sensitivity and a precision has also been proposed (Japan Patent Application Laid-Open No. 57-37277).

However, none of the above magnetic flux measuring apparatus resolved a problem of variation of measured value by a change of temperature. A measuring magnetic field in glass or crystal which is a highly insulative medium varies with the temperature. As the temperature changes, an index of refraction of the medium changes or birefringence changes.

The following references are cited to show the state of art:

(i) Japan Utility Model Registration Application Laid-Open No. 57-14879, (ii) Japan Patent Application Laid-Open No. 56-29174, and (iii) Japan Patent Application Laid-Open No. 57-37277.

It is an object of the present invention to provide an apparatus capable of safely and easily measuring a magnetic-field in a spatially narrow area with a high stability for a change of temperature.

In order to achieve the above object, an optical magnetic-field measuring apparatus of the present invention comprises a light source, a magnetic-field detector including a magnetic material of a medium having a Faraday rotation property, a measuring unit for measuring a light from the detector, and an optical transmission line for optically coupling the detector and the measuring unit. The medium of the magnetic material having the Faraday rotation property contains a composition represented by a general formula of $R_3(Fe_{5-x}M_x)O_{12}$ (where R is at least one element selected from a group consisting of La, Sm, Lu, Ca and Bi or at least two elements selected from the group with Y being added thereto, M is at least one element selected from a group consisting of Ga, Ge, Al, Si, Sc, In and Cr and a range of x is $0 \leq x \leq 1.5$), and at least one magnetic garnet thin film magnetized in a direction of transmission of light, whose Faraday rotation property (Verdet constant) exhibits a good temperature characteristic.

In general, the temperature stability of the magnetic-field measuring apparatus which utilizes the magnetic garnet thin film depends on the temperature characteristic of the Faraday rotation property (Verdet constant) of the thin film.

This trend is particularly remarkable in the measuring apparatus of the type which uses a polarized beam splitter or separates an optical carrier wave and an optical signal wave by a frequency difference therebetween to compensate an optical fluctuation of the light source.

The inventors of the present invention experimentarily studied a relation between the temperature characteristic of the Faraday rotation property of the magnetic garnet thin film and a temperature characteristic of a ratio ($4\pi Ms/Ho$) of a saturation flux density $4\pi Ms$ of the thin film to a collapse field Ho of a strip domain, and found that there is a strong correlation therebetween.

It has been found by the inventors that in order to attain an optical magnetic-field measuring apparatus having a good temperature characteristic, it is necessary to use a magnetic film having the ratio $4\pi Ms/Ho$ whose temperature characteristic is excellent in overall.

The optical magnetic-field measuring apparatus having a high temperature stability is attained by using a magnetic film which exhibits a good temperature characteristic of $4\pi Ms/Ho$ or using a plurality of such magnetic films in stack, or using two sets of magnetic films equal in number, the temperature characteristic of $4\pi Ms/Ho$ in one set being positive and that in the other set being negative and variation rates in both sets being equal. Assuming that a working temperature range is a room temperature (20° C.) ±30° C., in order to meet a minimum temperature stability requirement (±3%) of a class 3 measuring instrument, it is necessary that the temperature stability of $4\pi Ms/Ho$ is within ±0–1%.

The optical magnetic field measuring apparatus of the present invention uses the magnetic garnet thin film whose $4\pi Ms/Ho$ exhibits a good temperature characteristic. The temperature characteristic of $4\pi Ms/Hs$ of at least one magnetic garnet film is within ±0.1%/°C., or the temperature characteristic of $4\pi Ms/Ho$ of at least one magnetic garnet thin film is positive and the temperature characteristic of $4\pi Ms/Ho$ of at least other one magnetic garnet thin film is negative and an overall temperature characteristic of both is within ±(0–1)%/°C. Preferably, an overall temperature characteristic of $4\pi Ms/Ho$ of all magnetic garnet thin films is within ±0.1%/°C.

In order to achieve a desired temperature characteristic of $4\pi Ms/Ho$ of the magnetic garnet thin film, a composition having the desired temperature characteristic is selected from the compositions described above.

The composition can be determined by a simple experiment.

In the composition of the magnetic garnet thin film represented by the general formula of $R_3(Fe_{5-x}M_x)O_{12}$, when $x > 1.5$, the Faraday rotation property by Fe element is very low.

The other construction than that described above may follow the prior art teachings or teaching disclosed in Japan Patent Application No. 57-21121 (counterport applications filed in U.S., Ser. No. 462,765, Canada and EPC).

The present invention will be apparent from the following detailed description taken in conjunction with the accompanying drawings, in which:

FIG. 1 is a graph showing a correlation between a temperature stability of a ratio ($4\pi Ms/Ho$) of a saturation flux density of a magnetic film to a collapse field of a strip domain and a temperature stability of a Faraday rotation property, FIG. 2 is shows a configuration of one embodiment of a magnetic field measuring apparatus of the present invention, FIG. 3 is a graph showing a measured temperature characteristic of $4\pi Ms/Ho$ of a magnetic film used in one embodiment of the present invention, and FIG. 4 is a graph showing a measured temperature characteristic of a magnetic field measurement output in one embodiment of the present invention.

Embodiment 1

An evaluation method and a selection method of a magnetic garnet thin film are first described.

The magnetic garnet thin film is formed on one or both surfaces (one surface in the present embodiment) of a {111} plane of $Gd_3 Ga_5 O_{12}$ single crystal by a constant temperature liquid phase epitaxial growth method. It is magnetized perpendicularly to the plane and has a thickness of 1–20 μm. Compositions are $(Y, Sm, Lu, Ca)_3 (Fe, Ge)_5 O_{12}$ and $(Y, Sm)_3(Fe, Ga)_5O_{12}$. Temperature variations of domain widths W of strip domains of the thin films prepared by various compositions were measured by observing the domains, and the temperature characteristics of $4\pi Ms/Ho$ were calculated (see, for example, Fowlis D.C. et al, AIP Conference Proceedings on "Magnetism and Magnetic Materials" p240 (1971)). The temperature characteristics of the Faraday rotation property (Verdet constant) were measured by measuring extinction positions by a He-Ne laser.

FIG. 1 shows a correlation between the temperature characteristics of $4\pi Ms/Ho$ of various magnetic films at 20° C., $$\left| \frac{Ho}{4\pi Ms} \quad \frac{d}{dT}\left(\frac{4\pi Ms}{Ho}\right) \right|_{20° C.} (\%/°C.) \text{ (abscissa)}$$

and the temperature characteristics of the Faraday rotation, that is, $$\left| \frac{1}{Ve} \quad \frac{d}{dT}(Ve) \right|_{20° C.} (\%/°C.) \text{ (ordinate),}$$

where Ve is the Verdet constant.

From FIG. 1, it is seen that both temperature coefficients substantially correspond to each other and they may be regarded essentially identical. Thus, an optical magnetic field measuring apparatus was manufactured by using four magnetic films (composition $Y_{1.1} Sm_{0.6} Lu_{0.6} Ca_{0.7} Fe_{4.3} Ge_{0.7} O_{12}$, film thickness 10 μm) whose temperature characteristic of $4\pi Ms/Ho$ is approximately $-0.04\%/°C.$ around room temperature. FIG. 2 shows a block diagram of the apparatus. The magnetic field measuring apparatus comprises a light source A, a magnetic field detector B, a measuring unit C and a light transmission unit D. The light source includes a light emitting diode 1 (wavelength 0.83 82 m). The magnetic field detector includes rod lenses 2-1 and 2-2, a polarizer 3, four magnetic films 4 and an analyzer 5. In the measuring unit, a light is received by a photo-diode 6 and a DC component and an AC component (signal component) are detected by a DC component detector 7 and an AC component detector 8, and a ratio of those components are calculated by a calculating circuit 9. The light transmission unit includes a multimode optical fiber having a core diameter of about 400 μm.

Figure 1:
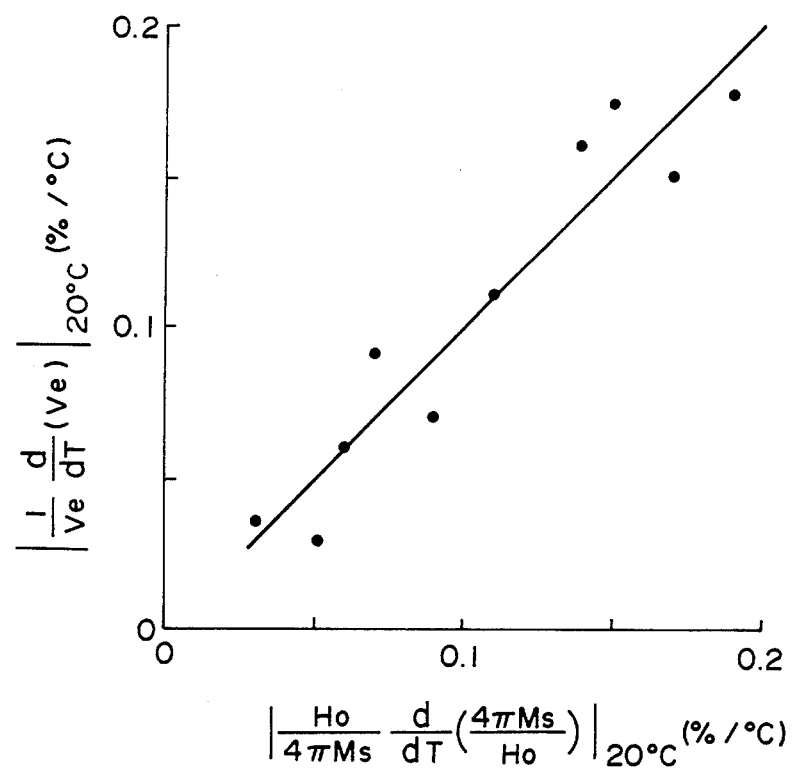
Figure 2:
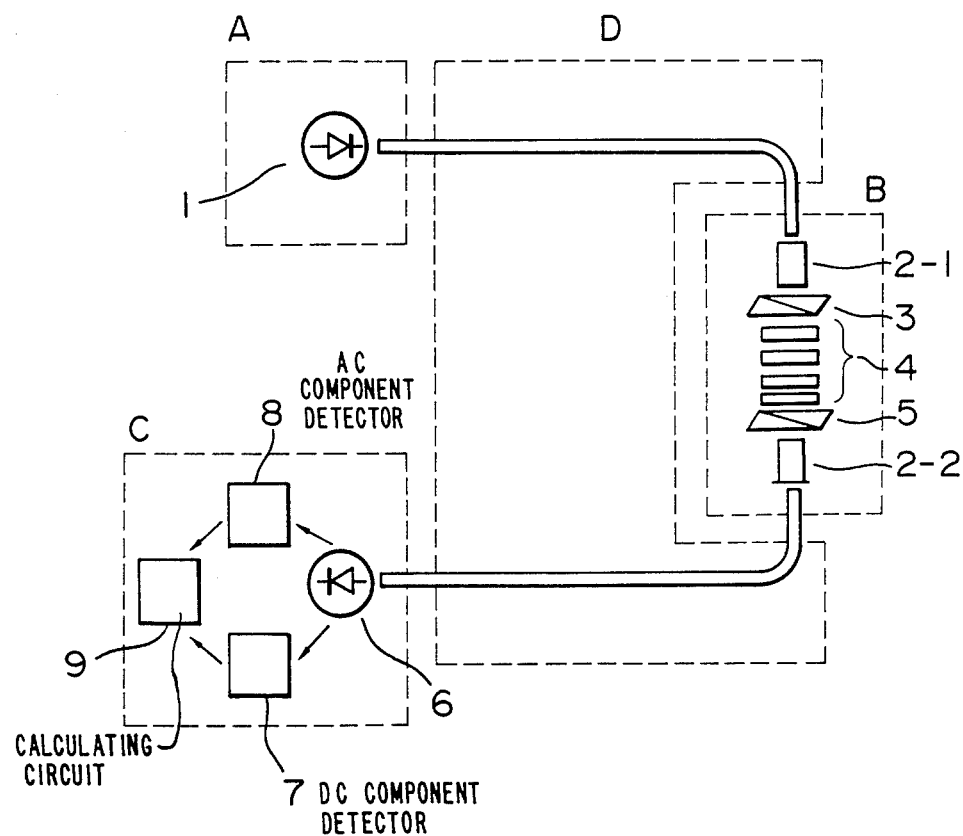
Figure 3:
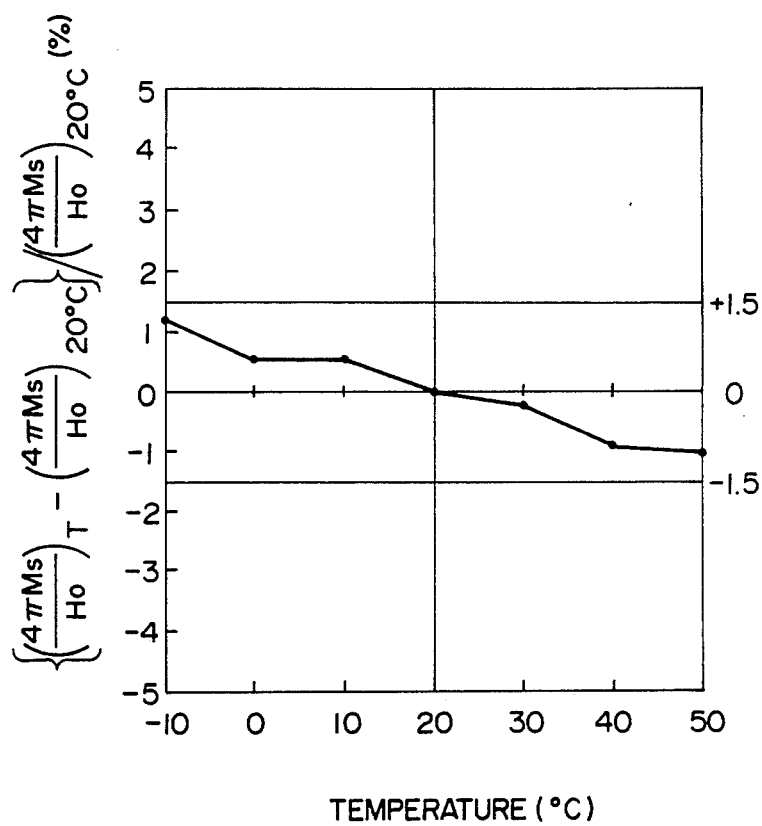
FIG. 3 shows a measured temperature characteristic of $4\pi Ms/Ho$ of the magnetic film, that is, a relation between the temperature (°C.) and $$\left\{ \left(\frac{4\pi Ms}{Ho}\right)_T - \left(\frac{4\pi Ms}{Ho}\right)_{20° C.} \right\} / \left(\frac{4\pi Ms}{Ho}\right)_{20° C.} (\%).$$
Figure 4:
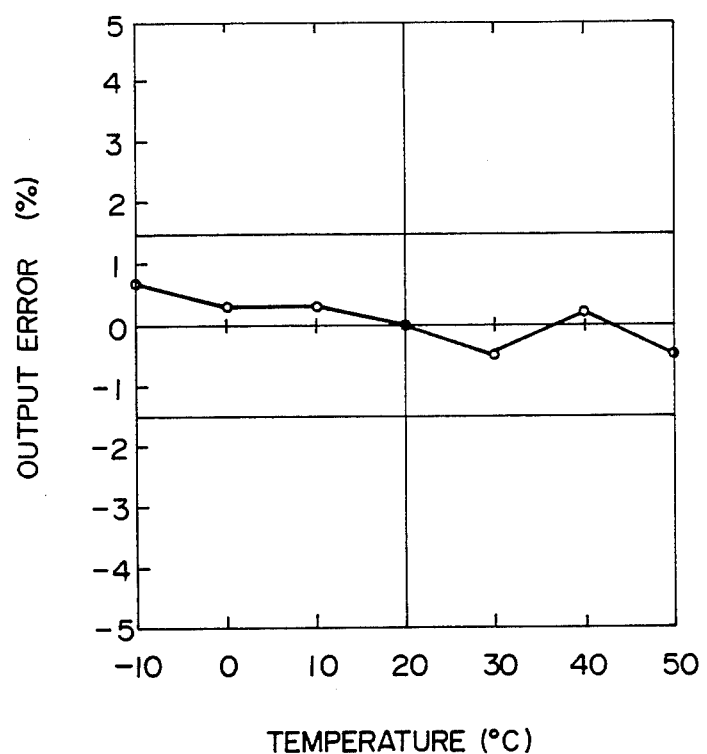
FIG. 4 shows a temperature characteristic of an output of the magnetic-field measuring apparatus shown in FIG. 2. As seen from FIG. 4, the optical magnetic-field measuring apparatus exhibited the output variation of less than ±1.5% in the temperature range of −10°–50° C.

Next, four magnetic films (composition $Y_{0.9} Sm_{0.8} Ca_{1.3} Fe_{3.7} Ge_{1.3} O_{12}$, film thickness 13 μm) were used to manufacture the measuring apparatus and similar tests were conducted. The temperature characteristic of $4\pi Ms/Ho$ of the magnetic films was $+0.03\%/°C.$ and the temperature stability of the output of the measuring apparatus was less than ±1% in the temperature range of −10°–50° C.

Further, four magnetic films (composition $Y_{2.5} Sm_{0.5} Fe_{4.7} Ga_{0.3} O_{12}$, film thickness 10 μm) were used and similar tests were conducted. The temperature characteristic of $4\pi Ms/Ho$ of the magnetic films was $-0.08\%/°C.$ and the temperature stability of the output of the measuring apparatus was approximately ±2.5% in the temperature range of −10°–50° C.

Embodiment 2

In place of the analyzer of the magnetic-field detector of the Embodiment 1, a polarized beam splitter is used to separate two orthogonal polarized signals, and two sets of the output light transmission optical fiber and the photo-diode are used to detect the outputs $P_1$ and $P_2$. The magnetic-field strength is determined by calculating $P = (P_1 - P_2)/(P_1 + P_2)$ by a calculation circuit and proportional relation between $P_1$ and the magnetic field strength.

Four magnetic films $(Y, Sm, Ca)_3 (Fe, Ge)_5 O_{12}$ were used. Two of them exhibited the $4\pi Ms/Ho$ temperature characteristics of approximately $+0.05\%/°C.$ (composition $(Sm_{0.15} Ca_{0.85}) (Fe_{4.15}Ge_{0.85})O_{12}$) and the other two of them exhibited the $4\pi Ms/Ho$ temperature characteristics of approximately $-0.05\%/°C.$ (composition $(Y_{1.7} Sm_{0.2} Ca_{1.1}) (Fe_{3.9} Ge_{1.1})O_{12}$).

The temperature characteristic of the optical magnetic-field measuring apparatus was less than ±2% in the temperature range of −10°–50°C.

In the above embodiments, R consists of Y, Sm, Lu and Ca, and M consists of Ge and Ga. Similar experiments were conducted for R consisting of only one of the above elements, R consisting of La or Bi or M consisting of Al, Si, Sc, In or Cr, or more than one of those elements, and similar results as those described above were obtained.

As described hereinabove, in accordance with the present invention, a high temperature stability is attained by using at least one magnetic film whose temperature characteristic of 4 $\pi$Ms/Ho is good, or using magnetic films at least one of which has a positive temperature characteristic of 4 $\pi$Ms/Ho and at least other one of which has a negative temperature characteristic of 4 $\pi$Ms/Ho, the variation rates of both being substantially equal. Accordingly, an optical magnetic field measuring apparatus having a high temperature stability and a wide application is provided by the present invention.

Obviously, many modifications and variations of the present invention are possible in the light of the above teachings. It is therefore to be understood that within the scope of the appended claims the present invention may be practised otherwise than as specifically described.

We claim:

1. An optical magnetic-field measuring apparatus comprising a light source, a magnetic-field detector including a magnetic material of a medium having a Faraday rotation property, a measuring unit for measuring a light from said detector and a light transmission path for optically coupling said detector and said measuring unit, wherein:

said magnetic material includes at least one magnetic garnet thin film having a composition represented by a general formula of $R_3(FE_{5-x}M_x)O_{12}$ (where R is selected from the group consisting of at least one element selected from the group consisting of La, Sm, Lu, Ca and Bi, and at least two elements selected from the group consisting of La, Sm, Lu, Ca and Bi admixed with Y, M is at least one element selected from the group consisting of Ga, Ge, Al, Si, Sc, In and Cr, and a range of x is $0 \leq x \leq 1.5$) and exhibiting when magnetized in a direction of light transmission a selected overall temperature characteristic of a ratio (4 $\pi$Ms/Ho) of a saturation flux density 4 $\pi$Ms of said thin film to a collapse field Ho of a strip domain which is determined based on a desired temperature characteristic of said measuring unit.

2. An optical magnetic-field measuring apparatus according to claim 1 wherein an overall temperature characteristic of the ratio (4 $\pi$Ms/Ho) of the saturation flux density to the collapse field of the strip domain of said magnetic garnet thin film is within ±0.1%/°C.

3. An optical magnetic-field measuring apparatus according to claim 2, wherein said magnetic material includes a plurality of said garnet thin films and a temperature characteristic of the ratio (4 $\pi$Ms/Ho) of the saturation flux density to the collapse field of the strip domain of at least one magnetic garnet thin film is within ±0.1% /°C.

4. An optical magnetic-field measuring apparatus according to Claim 2 wherein the temperature characteristic of the ratio (4 $\pi$Ms/Ho) of the saturation flux density to the collapse field of the strip domain of at least one magnetic garnet thin film is positive and the temperature characteristic of at least other one magnetic garnet thin film is negative, and an overall temperature characteristic is within ±0.1%/°C.

5. An optical magnetic-field measuring apparatus according to claim 1, wherein R is at least two elements selected from the group consisting of La, Sm, Lu, Ca and Bi admixed with Y.

6. An optical magnetic-field measuring apparatus according to claim 5, wherein an overall temperature characteristic of the ratio (4 $\pi$Ms/Ho) of the saturation flux density to the collapse field of the strip domain of said magnetic garnet thin film is within ±0.1%/°C.

7. An optical magnetic-field measuring apparatus according to claim 5, wherein said magnetic material includes a plurality of said magnetic garnet thin films and a temperature characteristic of the ratio (4 $\pi$Ms/Ho) of the saturation flux density to the collapse field of the strip domain of at least one magnetic garnet thin film is within ±0.1%/°C.

8. An optical magnetic-field measuring apparatus according to claim 5, wherein the temperature characteristic of the ratio (4 $\pi$Ms/Ho) of the saturation flux density to the collapse field of the strip domain of at least one magnetic garnet thin film is positive and the temperature characteristic of at least other one magnetic garnet thin film is negative, and an overall temperature characteristic is within ±0.1%/°C.

* * * * *